United States Patent
Bella

(10) Patent No.: US 11,662,570 B2
(45) Date of Patent: May 30, 2023

(54) MEMS SCANNER SUSPENSION SYSTEM ENABLING HIGH FREQUENCY AND HIGH MECHANICAL TILT ANGLE FOR LARGE MIRRORS

(71) Applicant: Infineon Technologies AG, Neubiberg (DE)

(72) Inventor: Malika Bella, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 341 days.

(21) Appl. No.: 16/904,186

(22) Filed: Jun. 17, 2020

(65) Prior Publication Data
US 2021/0396990 A1    Dec. 23, 2021

(51) Int. Cl.
| G02B 26/08 | (2006.01) |
| G01S 7/481 | (2006.01) |
| B81B 3/00 | (2006.01) |
| G02B 26/10 | (2006.01) |

(52) U.S. Cl.
CPC ........ *G02B 26/0833* (2013.01); *B81B 3/0043* (2013.01); *G01S 7/4817* (2013.01); *G02B 26/105* (2013.01); *B81B 2201/042* (2013.01)

(58) Field of Classification Search
CPC .............. G02B 26/0833; G02B 26/105; G02B 26/0841; B81B 3/0043; B81B 2201/042; B81B 2203/058; B81B 2201/033; B81B 2203/0154; G01S 7/4817; G01S 17/88
See application file for complete search history.

(56) References Cited

U.S. PATENT DOCUMENTS

| 10,534,170 B2 | 1/2020 | Procopio et al. |
| 10,877,263 B2 | 12/2020 | Van Lierop et al. |
| 11,442,265 B2 | 9/2022 | Van Lierop et al. |
| 2010/0290142 A1 | 11/2010 | Krastev et al. |
| 2019/0361223 A1* | 11/2019 | Albert ................ G02B 26/0833 |

FOREIGN PATENT DOCUMENTS

| CN | 204116713 U | 1/2015 |
| CN | 108121065 A | 6/2018 |
| CN | 109725414 A | 5/2019 |
| CN | 110780279 A | 2/2020 |
| CN | 110927960 A | 3/2020 |
| CN | 111090086 A | 5/2020 |
| JP | 2006010715 A | 1/2006 |

* cited by examiner

*Primary Examiner* — Euncha P Cherry
(74) *Attorney, Agent, or Firm* — Harrity & Harrity, LLP

(57) ABSTRACT

A microelectromechanical system (MEMS) device including an oscillator structure configured to oscillate about a rotation axis; a frame that is rotationally fixed, the frame including a frame recess within which the oscillator structure is suspended; and a suspension assembly mechanically coupled to and between the oscillator structure and the frame, the suspension assembly configured to suspend the oscillator structure within the frame recess. The suspension assembly includes a central support beam that extends lengthwise along the rotation axis, the central support beam being mechanically coupled to and between the oscillator structure and the frame; a first outer support beam mechanically coupled to the oscillator structure and laterally displaced from the central support beam in a first direction orthogonal to the rotation axis; and at least one first interior support beam directly coupled to and between the central support beam and the first outer support beam.

27 Claims, 8 Drawing Sheets

MEMS SCANNER SUSPENSION SYSTEM ENABLING HIGH FREQUENCY AND HIGH MECHANICAL TILT ANGLE FOR LARGE MIRRORS

BACKGROUND

Light Detection and Ranging (LIDAR), is a remote sensing method that uses light in the form of a pulsed laser to measure ranges (variable distances) to one or more objects in a field of view. In particular, a microelectromechanical system (MEMS) mirror is used to scan light across the field of view. Arrays of photodetectors receive reflections from objects illuminated by the light, and the time it takes for the reflections to arrive at various sensors in the photodetector array is determined. This is also referred to as measuring time-of-flight (TOF). LIDAR systems form depth measurements and make distance measurements by mapping the distance to objects based on the time-of-flight computations. Thus, the time-of-flight computations can create distance and depth maps, which may be used to generate images.

A LIDAR scanning system may include one or more scanning mirrors and corresponding circuitry for scanning different field of views in the horizontal and/or vertical direction. MEMS mirrors operated at a certain resonance frequency may be impacted by various systematic and non-systematic error sources. For example, a scanning mirror may be a non-linear oscillator with a dependency between angle amplitude and frequency.

Current, small-sized MEMS scanners (e.g., oscillating structures, such as MEMS mirrors) show limitations in reachable (maximum) angular range and field of view, for example, in a LIDAR application. For example, a MEMS mirror may oscillate about a scanning axis from $+/-\theta$ max, where $\theta$ max represents a maximum tilt angle of the MEMS mirror and $+/-\theta$ max represents the maximum angular range of the oscillation. The maximum angular range defines the field of view, which is a scanning plane into which the transmitted light is projected. Two opposing edges of the field of view corresponds to $+\theta$ max and $-\theta$ max, respectively. A neutral position of the MEMS mirror is at $0°$.

A MEMS scanner, such as a mirror, may be circular or elliptical and its size is defined by its longest diameter. In the case of an elliptical mirror, the longest diameter corresponds to the length of the major axis, which may extend perpendicular to the scanning axis. A crucial parameter of a MEMS scanner is the limited dynamic deformation allowed which scales with the thickness of the mirror body. For example, thinner, lighter plates leads to increased dynamic deformation for a fixed frequency which causes distortion in transmitted and/or received light beams. Thus, there is limited freedom to reduce the inertia as it will also impact the dynamic deformation. Scaling of the MEMS scanner size to increase the size of the mirror leads to high inertia that needs to be compensated by high stiffness suspensions to maintain an operating frequency of the oscillation above 2 kHz. An operating frequency above 2 kHz enables high refresh rates and also avoids sensitivity to vibrations in automotive applications. A high refresh rate is important in order to scan an environment at a high speed and acquire fast-changing scenery data. A scanner that is robust against vibrations is important since vibrations will impair the scanning operation, leading to measurement inaccuracies and the inability to meet safety requirements in the automotive industry (e.g., for safety controls and autonomous driving).

However, high stiffness suspensions limit the mechanical angle of the scanner since an increase in the mechanical stress level scales along with the stiffness increase. For a silicon-based MEMS device, a safe mechanical stress limit may be in the order of 1-2 gigapascal (GPa). However, this safe mechanical stress limit may vary based on processing method, quality, and design parameters, and may be higher than 2 GPa. Thus, the high stiffness suspensions pose an issue with limiting the maximum angular range of the oscillation due to the requirement to stay within the bounds of a safe mechanical stress limit (e.g., 2 GPa or less). For example, for a MEMS scanner having a longest diameter of 5 millimeters (mm) or greater, it may be difficult to achieve a maximum angular tile angle of $10°$ or greater due to the aforementioned design constraints. Since the maximum angular range of the oscillation is limited, the size of the field of field is also limited.

Therefore, an improved MEMS oscillating structure, such as a MEMS mirror, having a large mirror diameter ($\geq 5$ mm) and a large maximum mechanical tilt angle ($\geq 10°$) while being operated and maintained in resonance at a high frequency ($\geq 2$ kHz) may be desirable.

SUMMARY

One or more embodiments provide a microelectromechanical system (MEMS) device that includes an oscillator structure configured to oscillate about a rotation axis; a frame that is rotationally fixed, the frame including a frame recess within which the oscillator structure is suspended; and a suspension assembly mechanically coupled to and between the oscillator structure and the frame, the suspension assembly configured to suspend the oscillator structure within the frame recess. The suspension assembly includes a central support beam that extends lengthwise along the rotation axis, the central support beam being mechanically coupled to and between the oscillator structure and the frame; a first outer support beam mechanically coupled to the oscillator structure and laterally displaced from the central support beam in a first direction orthogonal to the rotation axis; at least one first interior support beam directly coupled to and between the central support beam and the first outer support beam; a second outer support beam mechanically coupled to the oscillator structure and laterally displaced from the central support beam in a second direction orthogonal to the rotation axis, wherein the second direction is opposite to the first direction; and at least one second interior support beam directly coupled to and between the central support beam and the second outer support beam.

One or more embodiments provide an oscillator system that includes an oscillator structure configured to oscillate about a rotation axis at a resonance frequency of at least 2 kHz with a maximum deflection angle of at least $10°$, wherein the oscillator structure incudes a main surface having a dimension of at least 5 millimeters; a frame that is rotationally fixed, the frame including a frame recess within which the oscillator structure is suspended; and a suspension assembly mechanically coupled to and between the oscillator structure and the frame, the suspension assembly configured to suspend the oscillator structure within the frame recess. The suspension assembly includes a central support beam that extends lengthwise along the rotation axis, the central support beam being mechanically coupled to and between the oscillator structure and the frame, wherein the central support beam twists about the rotation axis as the oscillator structure oscillates and has a mechanical stress level of 3 GPa or less while the oscillator structure oscillates about the rotation axis at the resonance frequency of at least 2 kHz with the maximum deflection angle of at least 10°; a first outer support beam mechanically coupled to the oscillator structure and laterally displaced from the central support beam in a first direction orthogonal to the rotation axis; at least one first interior support beam directly coupled to and between the central support beam and the first outer support beam; a second outer support beam mechanically coupled to the oscillator structure and laterally displaced from the central support beam in a second direction orthogonal to the rotation axis, wherein the second direction is opposite to the first direction; and at least one second interior support beam directly coupled to and between the central support beam and the second outer support beam.

BRIEF DESCRIPTION OF THE DRAWINGS

Embodiments are described herein making reference to the appended drawings.

DETAILED DESCRIPTION

Figure 1:
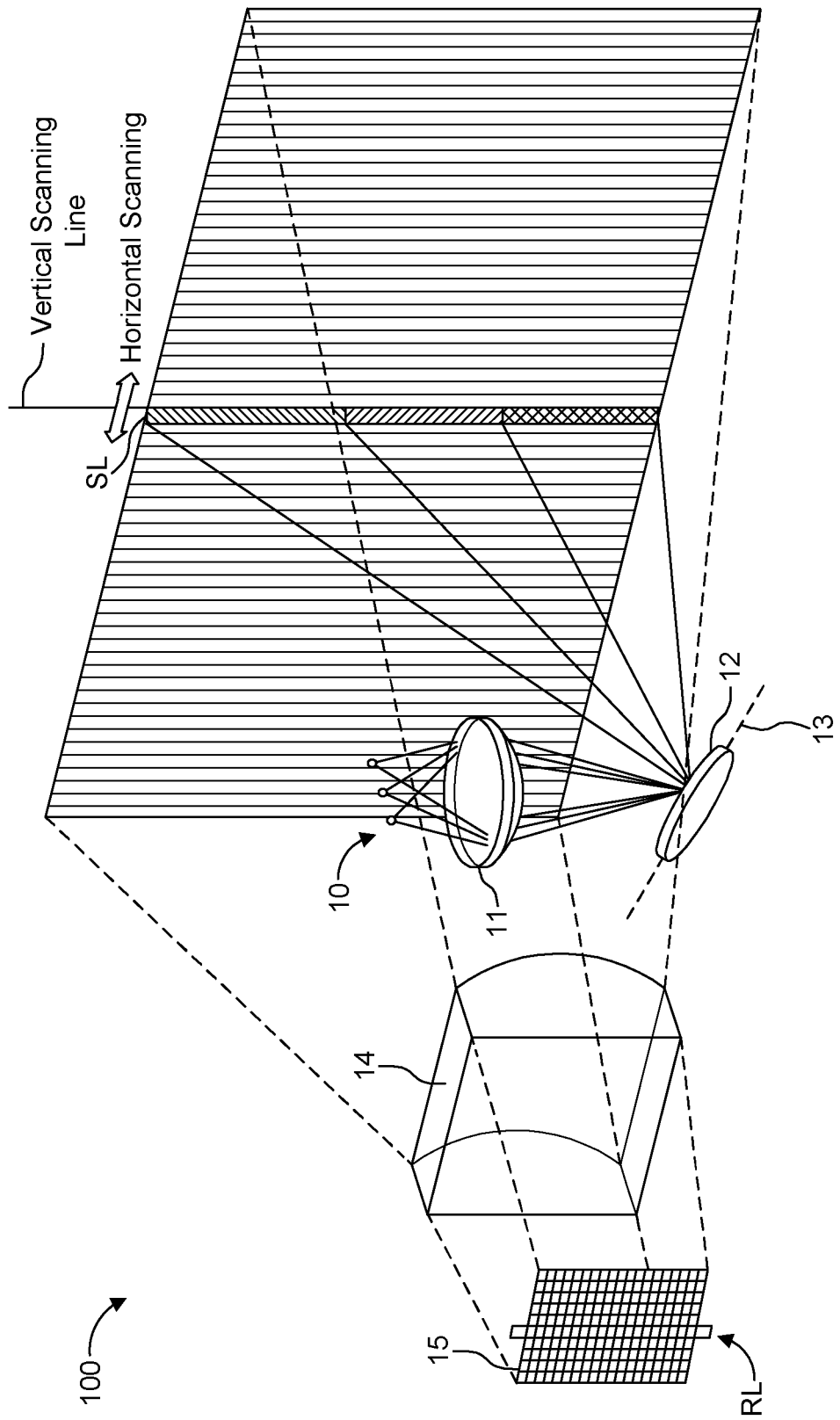
FIG. 1 is a schematic diagram of a LIDAR scanning system in accordance with one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photons of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

In Light Detection and Ranging (LIDAR) systems, a light source transmits light pulses into a field of view and the light reflects from one or more objects by backscattering. In particular, LIDAR is a direct Time-of-Flight (TOF) system in which the light pulses (e.g., laser beams of infrared light) are emitted into the field of view, and a pixel array detects and measures the reflected beams. For example, an array of photodetectors receives reflections from objects illuminated by the light.

Differences in return times for each light pulse across multiple pixels of the pixel array can then be used to make digital 3D representations of an environment or to generate other sensor data. For example, the light source may emit a single light pulse, and a time-to-digital converter (TDC) electrically coupled to the pixel array may count from the time the light pulse is emitted, corresponding to a start signal, until a time the reflected light pulse is received at the receiver (i.e., at the pixel array), corresponding to a stop signal. The "time-of-flight" of the light pulse is then translated into a distance.

In another example, an analog-to-digital converter (ADC) may be electrically coupled to the pixel array (e.g., indirectly coupled with intervening elements in-between) for pulse detection and ToF measurement. For example, an ADC may be used to estimate a time interval between start/stop signals with an appropriate algorithm. For example, an ADC may be used detect an analog electrical signal from one or more photodiodes to estimate a time interval between a start signal (i.e., corresponding to a timing of a transmitted light pulse) and a stop signal (i.e., corresponding to a timing of receiving an analog electrical signal at an ADC with an appropriate algorithm.

A scan such as an oscillating horizontal scan (e.g., from left to right and right to left of a field of view) or an oscillating vertical scan (e.g., from bottom to top and top to bottom of a field of view) can illuminate a scene in a continuous scan fashion. Each firing of the laser beam by the light sources can result in a scan line in the "field of view." By emitting successive light pulses in different scanning directions, an area referred to as the field of view can be scanned and objects within the area can be detected and imaged. Thus, the field of view represents a scanning plane having a center of projection. A raster scan could also be used.

FIG. 1 is a schematic diagram of a LIDAR scanning system 100 in accordance with one or more embodiments. The LIDAR scanning system 100 is an optical scanning device that includes a transmitter, including an illumination unit 10, a transmitter optics 11, and a one-dimensional (1D) microelectromechanical system (MEMS) mirror 12, and a receiver, including a second optical component 14 and a photodetector detector array 15.

The illumination unit 10 includes multiple light sources (e.g., laser diodes or light emitting diodes) that are linearly aligned in single bar formation and are configured to transmit light used for scanning an object. The light emitted by the light sources is typically infrared light although light with another wavelength might also be used. As can be seen in the embodiment of FIG. 1, the shape of the light emitted by the light sources is spread in a direction perpendicular to the transmission direction to form a light beam with an oblong shape perpendicular to a transmission. The illumination light transmitted from the light sources are directed towards the transmitter optics 11 configured to focus each laser onto a one-dimensional MEMS mirror 12. The transmitter optics 11 may be, for example, a lens or a prism.

When reflected by the MEMS mirror 12, the light from the light sources are aligned vertically to form for each emitted laser shot a one-dimensional vertical scanning line SL of infrared light or a vertical bar of infrared light. Each light source of the illumination unit 10 contributes to a different vertical region of the vertical scanning line SL. Thus, the light sources may be concurrently activated and concurrently deactivated to obtain a light pulse with multiple segments, where each segment corresponds to a respective light source, However, each vertical region or segment of the vertical scanning line SL may also be independently active or inactive by turning on or off a corresponding one of the light sources of the illumination unit 10. Thus, a partial or full vertical scanning line SL of light may be output from the system 100 into the field of view.

Accordingly, the transmitter of the system 100 is an optical arrangement configured to generate laser beams based on the laser pulses, the laser beams having an oblong shape extending in a direction perpendicular to a transmission direction of the laser beams.

In addition, while three laser sources are shown, it will be appreciated that the number of laser sources are not limited thereto. For example, the vertical scanning line SL may be generated by a single laser source, two laser sources or more than three laser sources.

Figure 3:
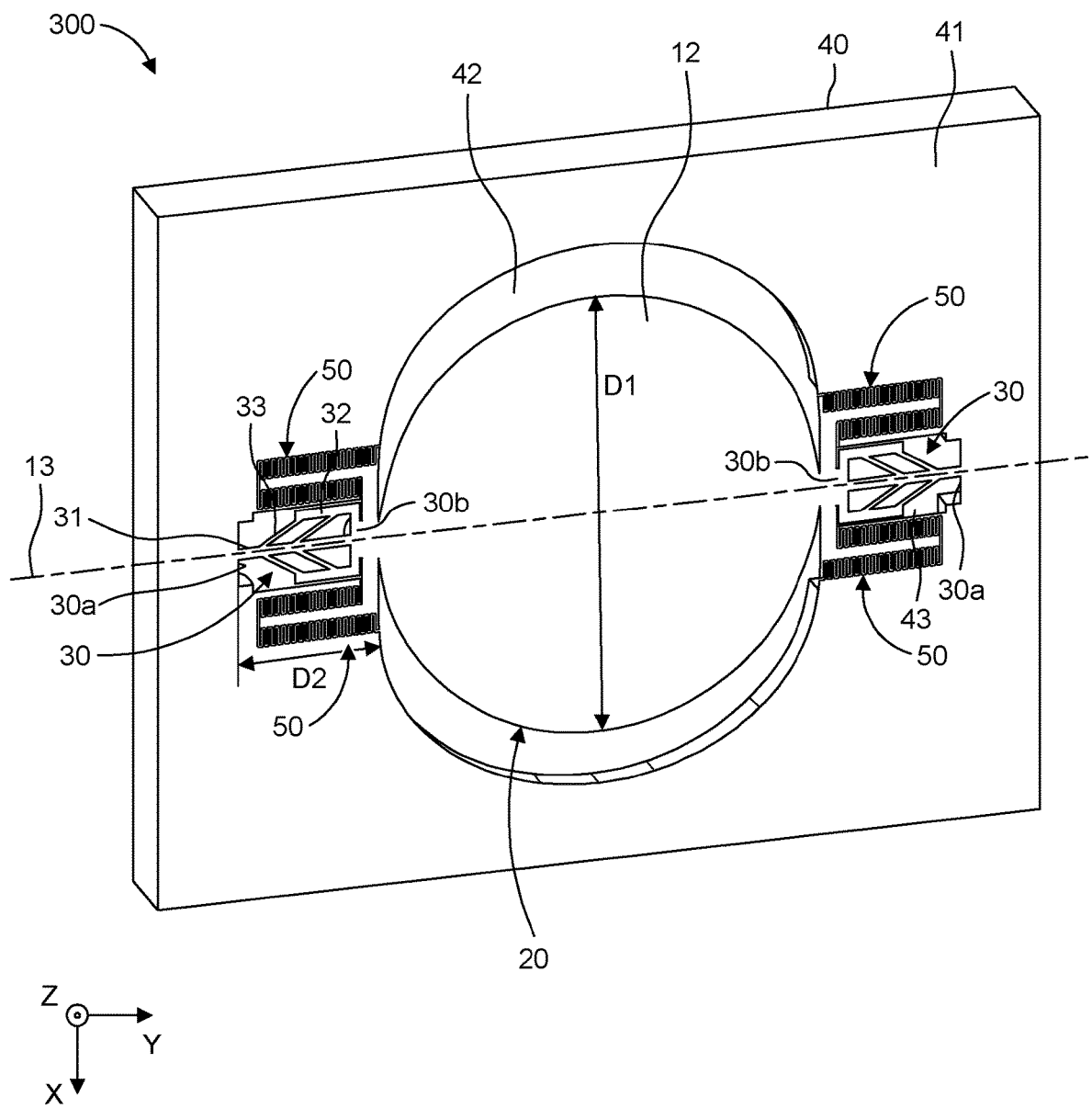
FIG. 3 shows a schematic view of an example of a MEMS device in accordance with one or more embodiments.

The MEMS mirror 12 is a mechanical moving mirror (i.e., a MEMS micro-mirror) integrated monolithically on a semiconductor chip (see FIG. 3). The MEMS mirror 12 according to this embodiment is suspended by mechanical suspension system that enables high frequency and large maximum mechanical tilt angle for large mirrors. As will be described in detail below, the MEMS device includes a mirror frame, the mechanical suspension system, and a mirror body that are monolithically integrated in a one-piece integral construction thereby forming a MEMS semiconductor chip. A reflective material may be deposited onto the silicon-based mirror body to form a reflective surface of the MEMS mirror 12.

In this example, the MEMS mirror 12 is configured to rotate about a single axis (i.e., a scanning axis) and can be said to have only one degree of freedom for movement. Due to this single axis of rotation, the MEMS mirror 12 is referred to as a 1D MEMS mirror.

In order to make a MEMS scanning mirror robust against vibrations, the mirror should have a low inertia, i.e., a light and stiff mirror body. In addition, the mirror should have a high stiffness of its suspension for all degrees-of-freedom (DOF) of the mirror body.

In order to achieve a light and stiff mirror body, the mirror body may comprise a relatively thin mirror and a thicker reinforcement structure for the mirror. The mirror body may be rotatably arranged in a mirror frame around a rotation axis extending in a plane defined by the mirror frame. The rotation axis may extend to first and second mutually opposite end-portions of the mirror body. The mirror body may have a reflective plane on a first main surface and, opposite the first main surface, a second main surface provided with the reinforcement structure.

In order to achieve a high stiffness suspension, the mirror body may be supported in the mirror frame using central support beams 31 extending along the rotation axis, outer support beams 32 symmetrically arranged on opposite sides of the central support beam 31, and interior support beams 33 that are coupled directly to the central support beam 31 and directly to a corresponding outer support beam 32, as illustrated in FIG. 3.

Generally, the central support beam 31 enables high mechanical angle tilting while keeping the mechanical stress in the central support beam 31 itself relatively low. The length, width, and thickness of the central support beam 31 can be adjusted to reach the desired stress level and the desired rotational or torsional stiffness about a rotation axis 13 (i.e., a scanning axis). The interior support beams 33 may provide support to the outer support beams 32. The interior support beams 33 add a small contribution to the rotational or torsional stiffness about the rotation axis 13 but are primarily used to increase the stiffness for undesired motions (i.e., other rotational and translational motions different from the rotational movement about the rotation axis 13).

For example, if the rotation axis 13 extends along a Y axis, as delectated in FIG. 3, the central support beam 31 provides the primary contribution to the rotational or torsional stiffness about a rotation axis 13, while the interior support beams 33 add a small contribution to the rotational or torsional stiffness about the rotation axis 13. In addition, the interior support beams 33 provide stiffness to undesired rotational movements about the X axis and the Z axis, as well as stiffness to undesired translational movements in the X and Z directions.

The design of the suspension assembly enables achieving high stiffness (torsional/rotational motion) around the target axis for operation to overcome the high inertia imposed by the size of the mirror 12 and thus enable high resonance frequency operation (≥2 kHz), while limiting the mechanical stress level at or below 3 GPa for large maximum mechanical tilt angles of 10° to 15°, and perhaps more preferably at or below 2 GPa depending on the target maximum mechanical tilt angle. Reducing the thickness of the mirror body, and thus reducing the inertia, is also constrained by an acceptable dynamic deformation that permits acceptable scanning operations of transmitted and received light beams. The safe mechanical stress limit for a silicon-based MEMS device may vary based on processing method, quality, and design parameters, and may be higher than 3 GPa. A lower mechanical stress limit helps to ensure that the suspension assembly does not fail during operation. Thus, it plays in important role in the design constrains of the overall system. However, the lower the mechanical stress limit, the more difficult it is to achieve larger tilt angles for large mirrors at high resonance frequencies that are still within the desired mechanical stress limit. Thus, the design of the suspension assembly may be such that a maximum mechanical tilt angle is achieved up to 11.5° while limiting the mechanical stress level at or below 2 GPa and a maximum mechanical tilt angle is achieved up to 15° while limiting the mechanical stress level at or below 3 GPa.

The suspension assembly is further configured to suppress higher undesired modes (other translation and rotational modes having significantly higher frequencies that the desired mode of operation).

Results of the low inertia and the high suspension stiffness of the mirror body may be high resonance frequencies and a good dynamic performance. These properties may also make the device which is operated at the resonance frequency around the main axis of rotation very fast. In normal operation, i.e., at resonance, accelerations at the mirror tips of typically 10000 G may be achieved. This may make any external vibration negligible.

The MEMS mirror 12 exhibits a non-linear behavior that may be due the stiffness of the suspension structure such that an oscillation frequency of the mirror increases with an increase in oscillation amplitude (i.e., deflection angle amplitude θ) in a non-linear manner.

Figure 2:
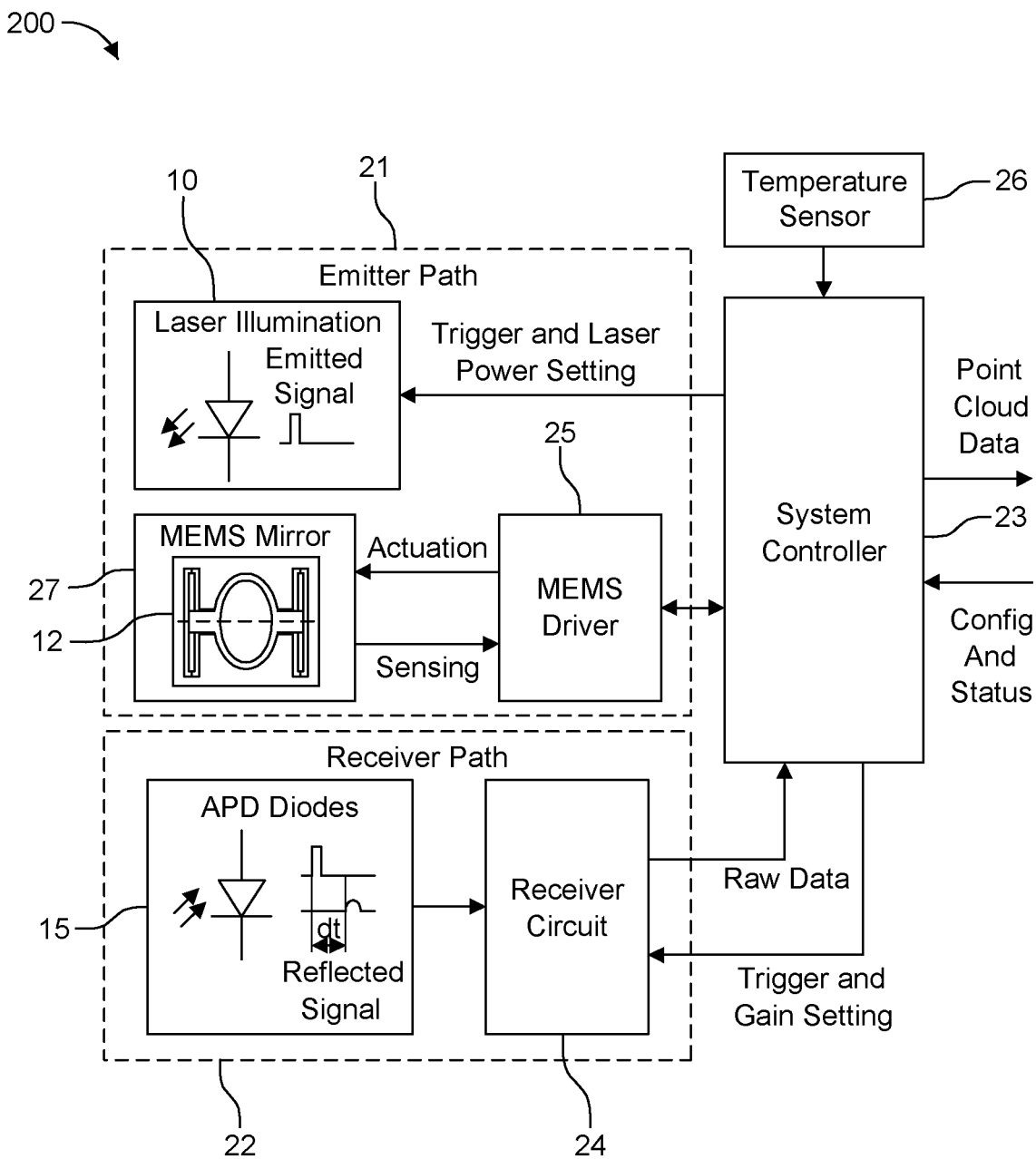
FIG. 2 is a schematic block diagram of the LIDAR scanning system in accordance with one or more embodiments.

The MEMS mirror 12 may be assembled in a chip package 27 shown in FIG. 2 to protect the mirror. For example, the MEMS mirror 12 may be hermetically sealed at a low pressure (i.e., at a pressure lower than atmospheric pressure) in a chip package. This low pressure may provide a low damping environment in which the MEMS mirror 12 operates.

Conceivable packages may include or differ by one or more of the following variants: different substrates (e.g., metal (leadframe), ceramic, organic (similar to printed circuit board (PCB) material)), and different optical lids or covers (e.g., optical material of glass, silicon, sapphire, etc.). Furthermore, the optical lids or covers may be cavity-forming caps, may be integrated into a frame (e.g., a metal frame), or assembled onto a pre-mold cavity or a ceramic cavity.

One or more methods (e.g., adhesive bonding, gluing, soldering, welding, and the like) or one or more different materials (e.g., silicone, glass solder, AuSn, and the like) may be used to bond one or more elements together (e.g., joining cap or lid to substrate). It will be appreciated that bonding methods may be interchangeable across various embodiments disclosed herein.

Alternatively, a wafer-level approach may be used such that a cavity-shaped lid may be directly mounted onto the MEMS chip (or even on wafer-level prior to singulation). Here, if the lid attachment leaves the electrical pads exposed, the sub-mount chip/lid can further be processed into a package using molding or casting processes.

The MEMS mirror 12 is a mechanical moving mirror (i.e., a MEMS micro-mirror) integrated on a semiconductor chip (see FIG. 3). The MEMS mirror 12 comprises a silicon-based mirror body with a reflective material deposited thereon. The MEMS mirror 12 according to this embodiment is configured to rotate about a single scanning axis and can be said to have only one degree of freedom for scanning. Distinguished from 2D-MEMS mirrors (2D MEMS scanners), in the 1D MEMS mirror, the single scanning axis is fixed to a non-rotating substrate and therefore maintains its spatial orientation during the oscillation of the MEMS mirror. Thus, a 1D oscillating MEMS mirror is by design more robust against vibrations and shocks than 2D MEMS mirror solutions. Due to this single scanning axis of rotation, the MEMS mirror 12 is referred to as a 1D MEMS mirror or 1D MEMS scanner. While embodiments describe using 1D oscillating MEMS mirrors, the suspension system described herein can be extended to 2D MEMS mirrors as well. In this case, suspension systems are used for each axis of a 2D MEMS mirror.

The MEMS mirror 12 itself is a non-linear resonator (i.e., a resonant MEMS mirror) configured to oscillate "side-to-side" about a single scanning axis 13 at a resonance frequency such that the light reflected from the MEMS mirror 12 (i.e., the vertical scanning line of light) oscillates back and forth in a horizontal scanning direction. A scanning period or an oscillation period is defined, for example, by one complete oscillation from a first edge of the field of view (e.g., left side) to a second edge of the field of view (e.g., right side) and then back again to the first edge. A mirror period of the MEMS mirror 12 corresponds to a scanning period.

Thus, the field of view is scanned in the horizontal direction by the vertical bar of light by changing the angle θ of the MEMS mirror 12 on its scanning axis 13. For example, the MEMS mirror 12 may be configured to oscillate at a resonance frequency of 2 kHz, between +/−11.25 degrees to steer the light over 22.5 degrees. Additional transmission optics may be provided to double the angular range that makes up the scanning range of the field of view. Thus, the field of view may be scanned, line-by-line, by a rotation of the MEMS mirror 12 through its degree of motion. One such sequence through the degree of motion (e.g., from −11.25 degrees to +11.25 degrees) is referred to as a single scan or scanning cycle. Multiple scans may be used to generate distance and depth maps, as well as 3D images by a processing unit.

While the transmission mirror is described in the context of a MEMS mirror, it will be appreciated that other 1D mirrors can also be used. In addition, the resonance frequency or the degree of rotation is not limited to 2 kHz and +/−11.25 degrees, respectively, according to the application. Thus, a one-dimensional scanning mirror is configured to oscillate about a single scanning axis and direct the laser beams at different directions into a field of view. Hence, a transmission technique includes transmitting the beams of light into the field of view from a transmission mirror that oscillates about a single scanning axis such that the beams of light are projected as a vertical scanning line SL into the field of view that moves horizontally across the field of view as the transmission mirror oscillates about the single scanning axis.

Upon impinging one or more objects, the transmitted bar of vertical light is reflected by backscattering back towards the LIDAR scanning system 100 as a reflected vertical line where the second optical component 14 (e.g., a lens or prism) receives the reflected light. The second optical component 14 directs the reflected light onto the photodetector detector array 15 that receives the reflected light as a receiving line RL and is configured to generate electrical measurement signals. The electrical measurement signals may be used for generating a 3D map of the environment and/or other object data based on the reflected light (e.g., via TOF calculations and processing).

The receiving line is shown as a vertical column of light that extends along one of the pixel columns in a lengthwise direction of the pixel column. The receiving line has three regions that correspond to the vertical scanning line SL shown in FIG. 1. As the vertical scanning line SL moves horizontally across the field of view, the vertical column of light RL incident on the 2D photodetector array 15 also moves horizontally across the 2D photodetector array 15. The reflected light beam RL moves from a first edge of the photodetector detector array 15 to a second edge of the photodetector detector array 15 as the receiving direction of the reflected light beam RL changes. The receiving direction of the reflected light beam RL corresponds to a transmission direction of the scanning line SL.

The photodetector array 15 can be any of a number of photodetector types; including avalanche photodiodes (APD), single-photon avalanche diode (SPAD), photocells, and/or other photodiode devices. Imaging sensors such as charge-coupled devices (CCDs) can be the photodetectors. In the examples provided herein, the photodetector array 15 is a two-dimensional (2D) APD array that comprises an array of APD pixels. In other embodiments, the photodetector array 15 may be a 1D array that includes a single column of photodiodes. The activation of the photodiodes may be synchronized with light pulses emitted by the illumination unit 10. Alternatively, a single photo detector call/pixel, as opposed to an array, may be used. For example, a single photo detector call/pixel may be used in case of a 2×1D scanning transmitter in a coaxial LIDAR architecture.

The photodetector array 15 receives reflective light pulses as the receiving line RL and generates electrical signals in response thereto. Since the time of transmission of each light pulse from the illumination unit 10 is known, and because the light travels at a known speed, a time-of-flight computation using the electrical signals can determine the distance of objects from the photodetector array 15. A depth map can plot the distance information.

In one example, for each distance sampling, a microcontroller triggers a laser pulse from each of the light sources of the illumination unit 10 and also starts a timer in a Time-to-Digital Converter (TDC) Integrated Circuit (IC). The laser pulse is propagated through the transmission optics, reflected by the target field, and captured by an APD of the APD array 15. The APD emits a short electrical pulse which is then amplified by an electrical signal amplifier. A comparator IC recognizes the pulse and sends a digital signal to the TDC to stop the timer. The TDC uses a clock frequency to calibrate each measurement. The TDC sends the serial data of the differential time between the start and stop digital signals to the microcontroller, which filters out any error reads, averages multiple time measurements, and calculates the distance to the target at that particular field position. By emitting successive light pulses in different directions established by the MEMS mirror, an area (i.e., a field of view) can be scanned, a three-dimensional image can be generated, and objects within the area can be detected.

Alternatively, instead of using the TDC approach, ADCs may be used for signal detection and ToF measurement. For example, each ADC may be used detect an analog electrical signal from one or more photodiodes to estimate a time interval between a start signal (i.e., corresponding to a timing of a transmitted light pulse) and a stop signal (i.e., corresponding to a timing of receiving an analog electrical signal at an ADC) with an appropriate algorithm.

It will be appreciated that the above-described horizontal scanning system 100 may also be used for vertical scanning. In this case, the scanning arrangement is arranged such that the scanning direction is rotated 90° such that the scanning line SL and the receiving line RL move in the vertical direction (i.e., from top to bottom or from bottom to top). As such, the scanning line is a horizontal scanning line SL that is projected into the field of view that moves vertically across the field of view as the transmission mirror oscillates about the single scanning axis. Furthermore, as the horizontal scanning line SL moves vertically across the field of view, the horizontal column of light RL incident on the 2D photodetector array 15 also moves vertically across the 2D photodetector array 15.

FIG. 2 is a schematic block diagram of the LIDAR scanning system 200 in accordance with one or more embodiments. In particular, FIG. 2 shows additional features of the LIDAR scanning system 200, including example processing and control system components such as a MEMS driver, a receiver circuit, and a system controller.

The LIDAR scanning system 200 includes a transmitter unit 21 that is responsible for an emitter path of the system 200, and a receiver unit 22 that is responsible for a receiver path of the system 200. The system also includes a system controller 23 that is configured to control components of the transmitter unit 21 and the receiver unit 22, and to receive raw data from the receiver unit 22 and perform processing thereon (e.g., via digital signal processing) for generating object data (e.g., point cloud data). Thus, the system controller 23 includes at least one processor and/or processor circuitry for processing data, as well as control circuitry, such as a microcontroller, that is configured to generate control signals. The LIDAR scanning system 200 may also include a temperature sensor 26.

The receiver unit 22 includes the photodetector array 15 as well as a receiver circuit 24. The receiver circuit 24 may include one or more circuitries or sub-circuitries for receiving and/or processing information. The receiver circuit 24 may receive the analog electrical signals from the APD diodes of the photodetector array 15 and transmit the electrical signals as raw analog data or raw digital data to the system controller 23. In order to transmit the raw data as digital data, the receiver circuit 24 may include an ADC and a field programmable gate array (FPGA). The receiver circuit 24 may also receive trigger control signals from the system controller 23 that triggers an activation of one or more APD diodes. The receiver circuit 24 may also receive gain setting control signals for controlling the gain of one or more APD diodes.

The transmitter unit 21 includes the illumination unit 10, the MEMS mirror 12, and a MEMS driver 25 configured to drive the MEMS mirror 12. In particular, the MEMS driver 25 actuates and senses the rotation position of the mirror, and provides position information (e.g., tilt angle or degree of rotation about the rotation axis) of the mirror to the system controller 23. Based on this position information, the laser sources of the illumination unit 10 are triggered by the system controller 23 and the photodiodes (e.g., APD diodes) are activated to sense, and thus measure, a reflected light signal. Thus, a higher accuracy in position sensing of the MEMS mirror results in a more accurate and precise control of other components of the LIDAR system.

The MEMS driver 25 may also measure and record mirror frequency and currents using a change in capacitance in a comb-drive rotor and stator of an actuator structure used to drive the MEMS mirror 12. The actuator structure of the MEMS mirror 12 further includes the suspension structure discussed above. Thus, the MEMS driver 25 may further include a measurement circuit configured to measure one or more characteristics of the MEMS mirror 12 described herein. The MEMS driver 25 may further include processing circuitry, including at least one processor (e.g., analog signal processing circuitry and/or digital signal processing circuitry) configured to process measurement information from the measurement circuit to evaluate a mechanical health of the MEMS mirror 12 and/or the state of the chip package.

Additionally, or alternatively, the system controller 23 may receive measurement information from the measurement circuit of the MEMS driver 25 and perform processing thereon. Thus, system controller 23 may further include processing circuitry, including at least one processor (e.g., analog signal processing circuitry and/or digital signal processing circuitry) configured to process measurement information from the measurement circuit to evaluate a mechanical health of the MEMS mirror 12 and/or the state of the chip package.

By sensing the rotation position of the MEMS mirror 12 about its rotation axis 13, the MEMS driver 25 can sense zero-crossing events of the MEMS mirror 12. A zero-crossing event is an instance when the MEMS mirror 12 has a rotation angle of 0° on its rotation axis 13. Specifically, it is the moment when the MEMS mirror 12 is parallel to the frame or in a neutral position. The neutral position may also be referred to as a resting position (e.g., when the MEMS mirror 12 comes to a stop after turning off the driving force). Since the MEMS mirror 12 oscillates back and forth between two rotation directions (e.g., clock-wise and counter-clockwise), a zero-crossing event occurs twice during a scanning period—once as the mirror oscillates in the first rotation direction and once as the mirror oscillates in the second rotation direction. It will also be appreciated that angle-crossing events at another predefined angle may also be used instead of a zero-crossing event.

The MEMS driver 25 may send the position information to the system controller 23 so that the system controller 23 can use the position information to control the triggering of the laser pulses of the illumination unit 10 and the activation of the photodiodes of the photodetector array 15. The position information may also be used by the system controller as feedback information such that the system controller 23 can maintain a stable operation of the MEMS mirror 12 via control signals provided to the MEMS driver 25 and also maintain synchronization with other MEMS mirrors.

The MEMS mirror 12 includes an actuator structure used to drive the mirror. The actuator structure includes interdigitated finger electrodes made of interdigitated mirror combs and frame combs to which a drive voltage (i.e., an actuation or driving signal) is applied by the MEMS driver 25. The drive voltage may be referred to as a high-voltage (HV). The drive voltage applied to the finger structure generates a corresponding capacitance. The drive voltage across the finger structure creates a driving force between interdigitated mirror comb electrodes and the frame comb electrodes, which creates a torque on the mirror body 20 about the rotation axis. The drive voltage can be switched or toggled on and off resulting in an oscillating driving force. The oscillating driving force causes the mirror to oscillate back and forth on its rotation axis between two extrema. Depending on the configuration, this actuation can be regulated or adjusted by adjusting the drive voltage off time, a voltage level of the drive voltage, or a duty cycle.

In other embodiments, an electromagnetic actuator may be used to drive the MEMS mirror 12. For an electromagnetic actuator, a driving current (i.e., an actuation or driving signal) may be used to generate the oscillating driving force. Thus, it will be appreciated that drive/driving voltage and drive/driving current may be used interchangeably herein to indicate an actuation signal or a driving signal, and both may generally be referred to as a driving force.

As the mirror oscillates, the capacitance or charge between the finger electrodes changes according to the mirror's rotation position. The MEMS driver 25 is configured to measure the capacitance or charge between the interdigitated finger electrodes, and determine a rotation position or angle position of the MEMS mirror 12 therefrom. By monitoring the capacitance or charge, the MEMS driver 25 can detect the zero-crossing events and a timing thereof, and can determine the deflection or the tilt angle of the MEMS mirror 12 at any given moment. The MEMS driver 25 can also use the measured capacitance to determine a mirror frequency, and record the information in memory at the MEMS driver 25 or at the system controller 23.

The sensing of the position of the MEMS mirror 12 is performed based on a detector that is configured to measure the capacitance or charge. For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific deflection position (e.g., tilt angle) of the MEMS mirror. By sensing the capacitance of the finger structure, the MEMS driver 25 can monitor and track the oscillations of the mirror, and determine a specific position of the MEMS mirror, including the zero-crossing.

One way to measure the capacitance is to measure a current flowing through the finger electrode structure, convert the measured current into a voltage, and then further correlate the voltage to a capacitance and/or a rotation angle θ. However, any method to measure the capacitance may be used. A rotation direction (e.g., positive or negative, left-to-right or right-to-left, clockwise or counter-clockwise, etc.) is also detected by measuring a change in capacitance over time, where a positive or a negative change indicates opposing rotation directions. The MEMS driver 25 can also record the currents and voltages measured during the measuring of the capacitance. Thus, increasing the accuracy of position sensing of the mirror may improve the overall accuracy of the LIDAR system Since the mirror is driven at an oscillation frequency (e.g., ≥2 kHz), when the mirror rotates in a first rotation direction (e.g., left-to-right or clockwise), it crosses a zero position (i.e., 0°) at a certain point of time. The same can be said when the mirror rotates in a second rotation direction (e.g., right-to-left or counter-clockwise), the mirror will cross the zero position at a certain point in time. These instances of crossing the zero position may be referred to as zero-crossing events which occur at zero-crossing times.

FIG. 3 shows a schematic view of an example of a MEMS device 1 in accordance with one or more embodiments. The MEMS device 300 may also be referred to as a MEMS semiconductor chip. Referring to FIG. 3, an example of a MEMS device 300, such as a MEMS scanning micro mirror, is now explained.

The MEMS device 300 comprises a mirror body 20, a mirror frame 40, and two mechanical suspension assemblies 30 disposed at opposite ends of the mirror body 20 along the rotation axis 13. The mirror frame 40, the mechanical suspension assemblies 30, and the mirror body 20 are monolithically integrated in a one-piece integral construction thereby forming a MEMS semiconductor chip. The mirror frame 40, the mechanical suspension assemblies 30, and the mirror body 20 are formed from a single block of semiconductor material (i.e., a semiconductor substrate) via etching and/or other semiconductor processing techniques.

The mirror body 20 comprises a mirror 12 that together form an oscillating structure. The mirror body 20 is arranged in the mirror frame 40. The frame 40 defines a plane, i.e., the (x, y) plane in FIG. 3. In particular, the mirror frame 40 has an upper main surface 41 that defines a chip plane. The main surface 41 of the mirror frame 40 and a main surface of the mirror body 20, on which the mirror 12 is deposited, may be formed from a same substrate surface. A frame recess 42 is formed into the body of the mirror frame 40 (i.e., into the semiconductor substrate from the main surface 41) and separates the mirror frame 40 from the mirror body 20 so that the mirror body 20 can oscillated about the rotation axis 13 while the mirror frame 40 remains rotationally fixed. Similarly, the top (main) surface of the suspension assemblies 30 is formed from the same substrate surface as the main surface 41 of the mirror frame 40 and a main surface of the mirror body 20.

The mirror body 20 is rotatable around a rotation axis 13 extending in the plane defined by the frame 40. Each suspension assembly 30 includes a frame interface 30a that is coupled to and integrated with the mirror frame 40 and a mirror body interface 30b that is coupled to and integrated with the mirror body 20. Each suspension assembly 30 further includes support beams, which may also be referred to as torsion beams, that are connected between the mirror body 20 and the frame 40 (i.e., extending from the frame support 30a to the mirror support 30b) along the rotation axis 13. The mirror body interface 30b supports the mirror body 20 via the connection of the support beams to the frame 40. Thus, the mirror body interface 30b may be referred to as a mirror support structure 30b. One of the support beams of each suspension assembly 30 is collinear with the rotation axis 13. This support beam may be referred to as a central support beam 31. The central support beams 31 connect parts of the mirror body 20 to parts of the frame 40 and permit the mirror body 20 to be rotated around rotation axis 13.

Those skilled in the art will appreciate that the shape of the mirror 12 can be any shape desired for a particular application, e.g., a circle, ellipse, square, rectangle or other shape as desired. The mirror may have dimension D1 of at least 5 mm, which defines its largest dimension in the X-Y plane (i.e., in the chip plane defined by the main (top) chip surface). In contrast, a length of the suspension assembly 30 may have a dimension D2. In this example, the length of dimension D2 may be 1.7 mm, but this dimension may be increased or decreased based on application.

The mirror frame 40 additionally defines a frame recess 42 in which the mirror body 20 is arranged. The mirror frame 40 may also be structured to define further recesses in which other components may be arranged, such as actuators and the suspension assemblies. For example, a suspension assembly recess 43 is defined between the mirror frame 40 and each suspension assembly 30 to allow the suspension assembly to rotate or twist as the mirror body 20 rotates about the rotation axis 13. Further recess portions or cavities are formed between the support beam structures of the suspension assemblies 30.

Torsional stiffness about the rotation axis 13 may be set using the suspension assemblies 30. The pair of central support beams 31 supports the mirror body 20 vertically within a cavity (i.e., the frame recess 42), i.e., perpendicular to a main surface 41 of the frame 40, at the rotation axis 13 while providing high torsional stiffness about the target axis 13 for operation and with reduced mechanical stress. The suspension assembly 30 also allows selective stiffness tuning using the interior support beams 33 that behave like springs. The interior support beams 33 may be used to fine tune the torsional stiffness about the target axis 13 by adapting their thickness or adapting the number thereof. The interior support beams 33 further increase the stiffness to the undesired translational and rotational modes and enable good mode separation, with the operation frequency of the first mode about the rotation axis 13 being then much lower than all the other undesired modes.

For example, the interior support beams 33 may provide a flexible coupling from the central support beam 31 to the mirror body 20. As a result, the interior support beams 33 have a relatively low torsional/rotational stiffness with respect to the rotational direction about the rotation axis 13. The interior support beams 33 have a relatively high stiffness in the other rotational and translational directions.

The natural frequency of the mirror body 20 may be substantially determined by the central support beams 31 The natural frequency as defined herein is the undamped frequency of the mirror body 20 (i.e., the mirror 12) about its rotation axis 13. The interior support beams 33 may define the out-of-plane rocking and vertical mode stiffness for the corresponding dynamic modes and corresponding resonance frequencies. The torsional stiffness about the rotation axis 13 can be decoupled from the out-of-plane rocking and vertical mode stiffness so that the out-of-plane rocking and vertical mode frequencies can be set to desired values, such as higher values, without influencing the torsional mode stiffness and resonance frequency. As defined herein, the Y axis is along the rotation axis 13, the X axis is perpendicular to the Y axis on the mirror plane when the mirror 12 is at rest, and the Z axis is perpendicular to and out of the mirror plane when the mirror 12 is at rest. The X, Y, and Z axis are axes of a tree dimensional Cartesian coordinate system.

The suspension assemblies are configured to enable a MEMS scanner to fulfill the following requirements: a large mirror diameter (≥5 mm), a large mechanical tilt angle (≥10°), high resonance frequency (≥2 kHz). In particular, the central support beams 31 twist about the rotation axis 13 as the mirror body 20 oscillates and has a mechanical stress level of 3 GPa or less while the mirror body 20 oscillates about the rotation axis 13 at the resonance frequency of at least 2 kHz with the maximum deflection angle of at least 10°. More particularly, the central support beams 31 have a mechanical stress level of 2 GPa or less with a maximum deflection angle of the mirror body 20 up to 11.5° and the central support beams 31 have a mechanical stress level of 3 GPa or less with a maximum deflection angle of the mirror body 20 up to 15°. In some arrangements of the suspension assemblies, the central support beams 31 may have a mechanical stress level of 1 GPa or less with a maximum deflection angle of the mirror body 20 up to 11°.

As each of the central support beams 31 twist, one side of each suspension assembly 30 dips into the frame recess 43 while the other side raises out of the frame recess 43. The two sides oscillate in and out of the frame recess 43 as the mirror body 20 oscillates about the rotation axis 13. The resonance frequency for rotation of the mirror 12 around the rotation axis 13 may be defined mainly by the inertia of the mirror body 20 and the stiffness of the suspension assemblies 30, which may be defined by the bending stiffness of the central support beams 31 and the interior support beams 33 and by the torsional and translational stiffness of the interior support beams 33. The bending stiffness of the central support beams 31 may be defined by the length, width, and, in particular, the thickness of the central support beams 31. The combined stiffness in X direction of the central support beams 31 and the interior support beams 33 may prevent movement of the mirror body 20 perpendicular to the rotation axis 13 (in the X direction) during operation. Likewise, the combined stiffness in Z direction of the central support beams 31 and the interior support beams 33 may prevent movement of the mirror body 20 perpendicular to the rotation axis 13 (in the Z direction) during operation.

The central support beams 31 may have a rectangular cross-section as a rectangular prism perpendicular to the rotation axis 13, with the long axis of the rectangle parallel to the rotation axis 13 and a short axis perpendicular to the rotation axis 13.

The MEMS device 300 may also include actuator structures 50 provided and integrated with semiconductor substrate. The actuator structures may be an extension of the suspension assemblies 30 and reside in an extension of the suspension assembly recess 43. The actuator structures 50 receive drive signals from the MEMS driver 25 and provides torque to drive the mirror body 20 about the rotation axis 13. In one example, the actuator structures 50 may by a comb drives that include mirror combs attached to the mirror body 20 interleaved with frame combs attached to the frame 40. Applying a difference in electrical potential between interleaved mirror combs and frame combs creates a driving force between the mirror combs and the frame combs, which creates a torque on the mirror body 20 about the rotation axis 13. An oscillating electrical potential can be applied to drive the mirror device at its natural frequency.

In other examples, actuation methods may include electromagnetic actuation and piezoelectric actuators. In electromagnetic actuation, the micro mirror may be "immersed" in a magnetic field and an alternating electric current through conductive paths may create the oscillating torque around the rotation axis 13. Piezoelectric actuators may be integrated in the leaf springs or the leaf springs may be made of piezoelectric material to produce alternating beam bending forces in response to an electrical signal and generate the oscillation torque.

The MEMS mirror 12 exhibits a non-linear behavior due the torsional stiffness about the rotation axis 13 caused by the suspension assemblies 30 such that an oscillation frequency of the mirror 12 increases with an increase in oscillation amplitude θ (i.e., deflection angle amplitude) in a non-linear manner. Thus, the stiffening of the central support beams 31 as the mirror rotates causes the MEMS mirror 12 to be more strongly non-linear.

FIGS. 4A-4H illustrate various suspension assemblies 30 implemented in a MEMS device 300 in accordance with one or more embodiments. Each of the suspension assemblies 30 illustrated in FIGS. 4A-4H includes a frame interface 30*a* that is coupled to and integrated with the mirror frame 40 and a mirror body interface 30*b* (i.e., a mirror support structure) that is coupled to and integrated with the mirror body 20. In addition, each of the suspension assemblies 30 includes a central support beam 31 extending along the rotation axis, two outer support beams 32 arranged on opposite sides of the central support beam 31, and interior support beams 33 that are coupled directly to the central support beam 31 and directly to a corresponding outer support beam 32.

Figure 4A:
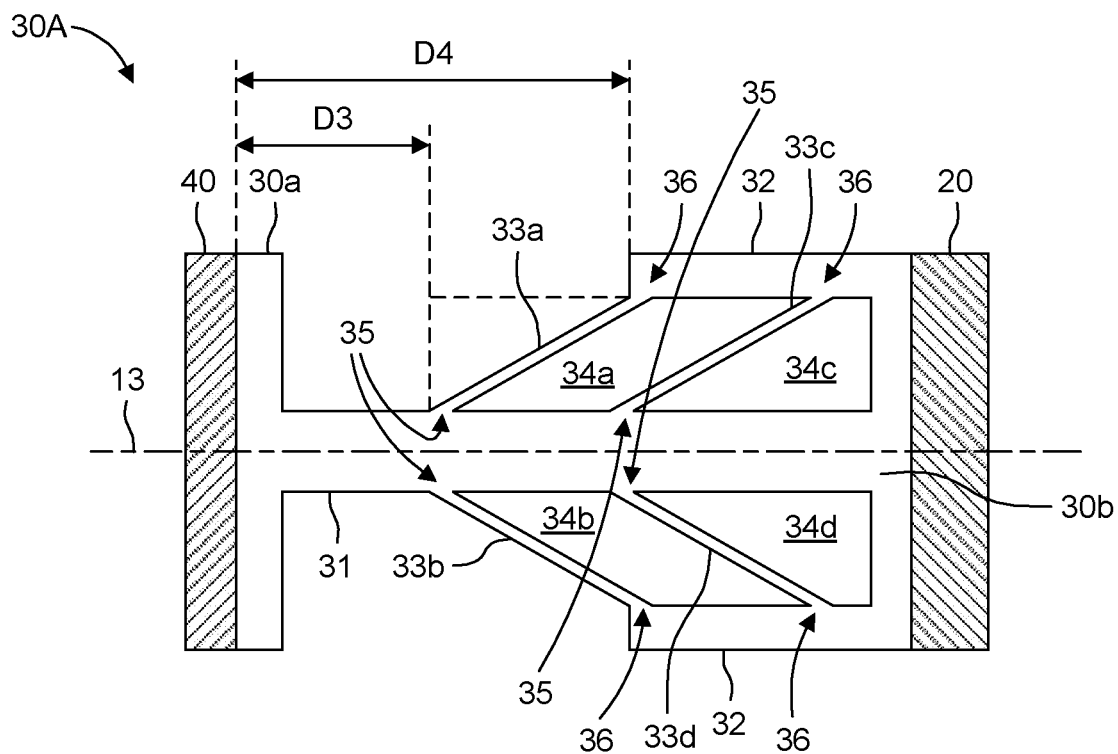
FIGS. 4A-4H illustrate various suspension assemblies implemented in a MEMS device in accordance with one or more embodiments.
Figure 4B:
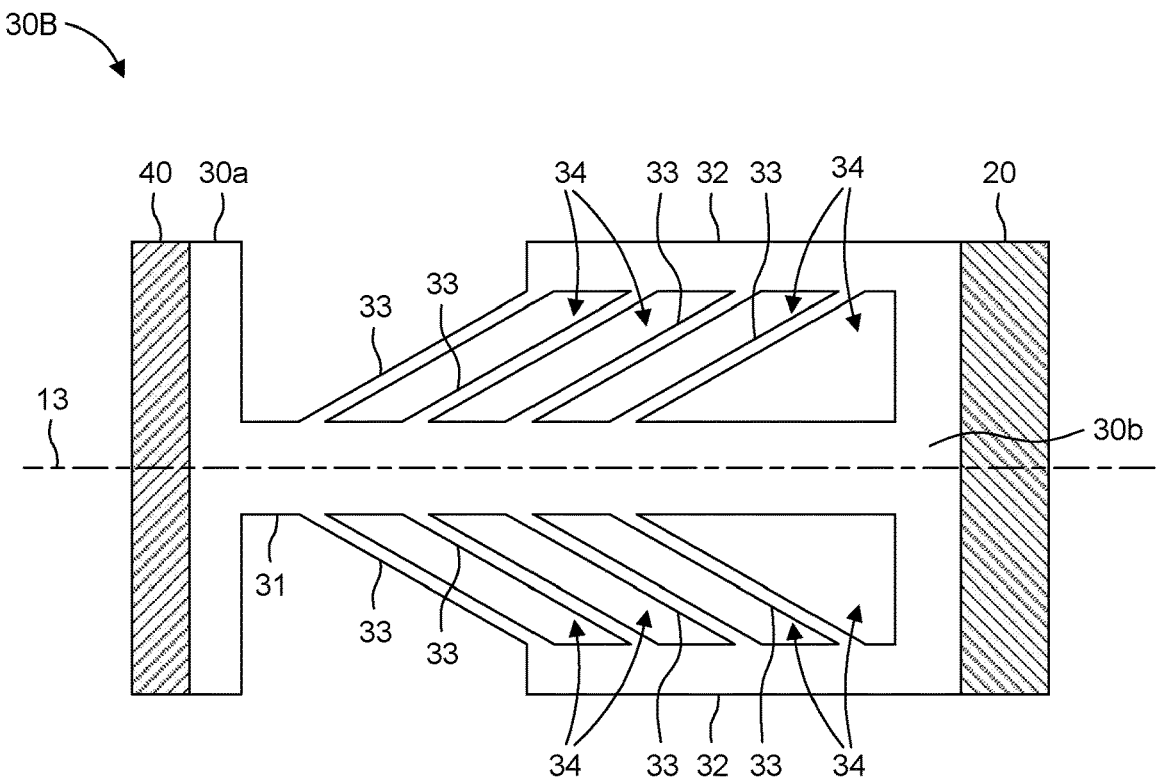
Figure 4C:
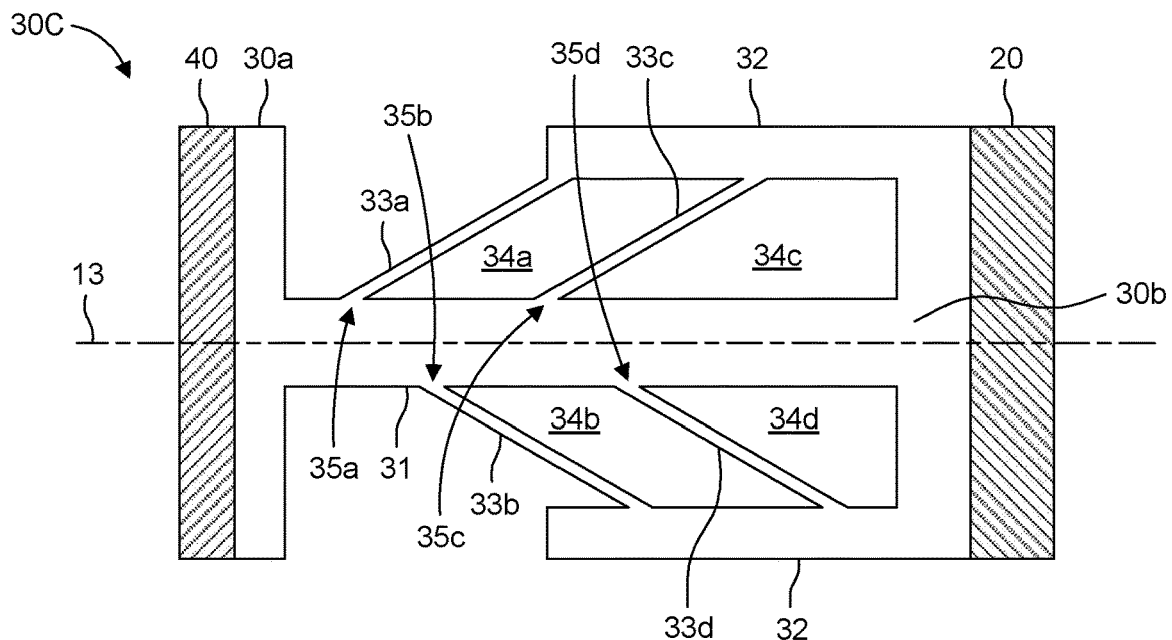
Figure 4D:
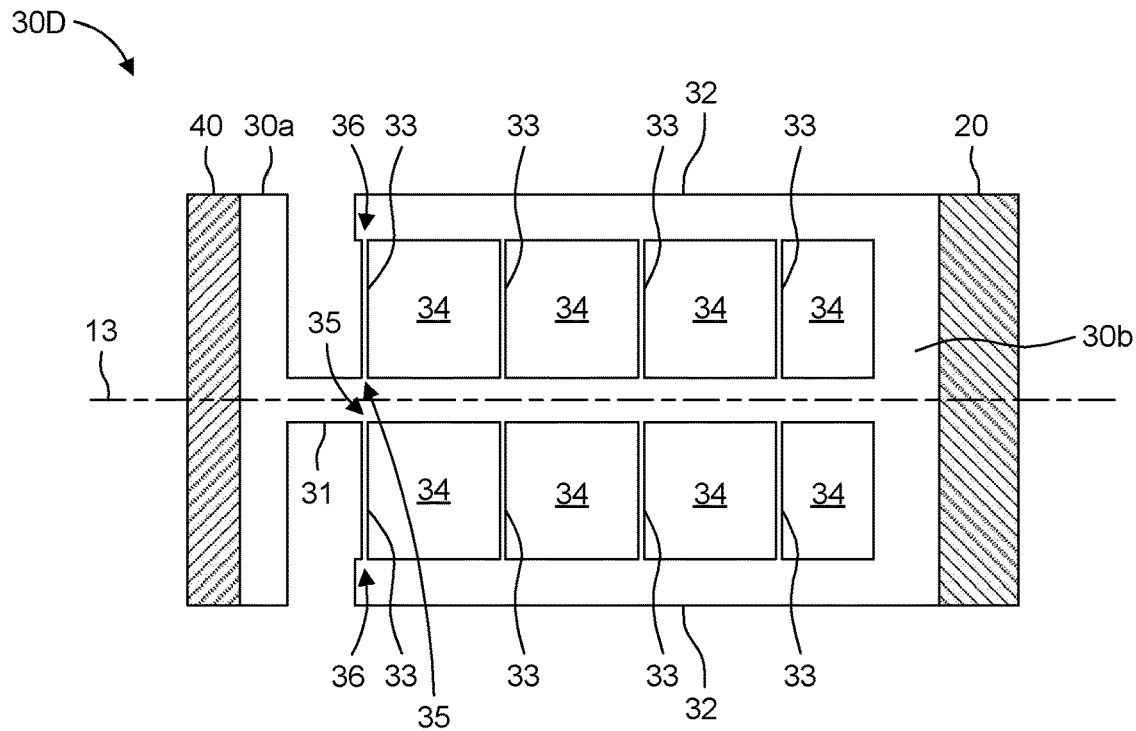
Figure 4E:
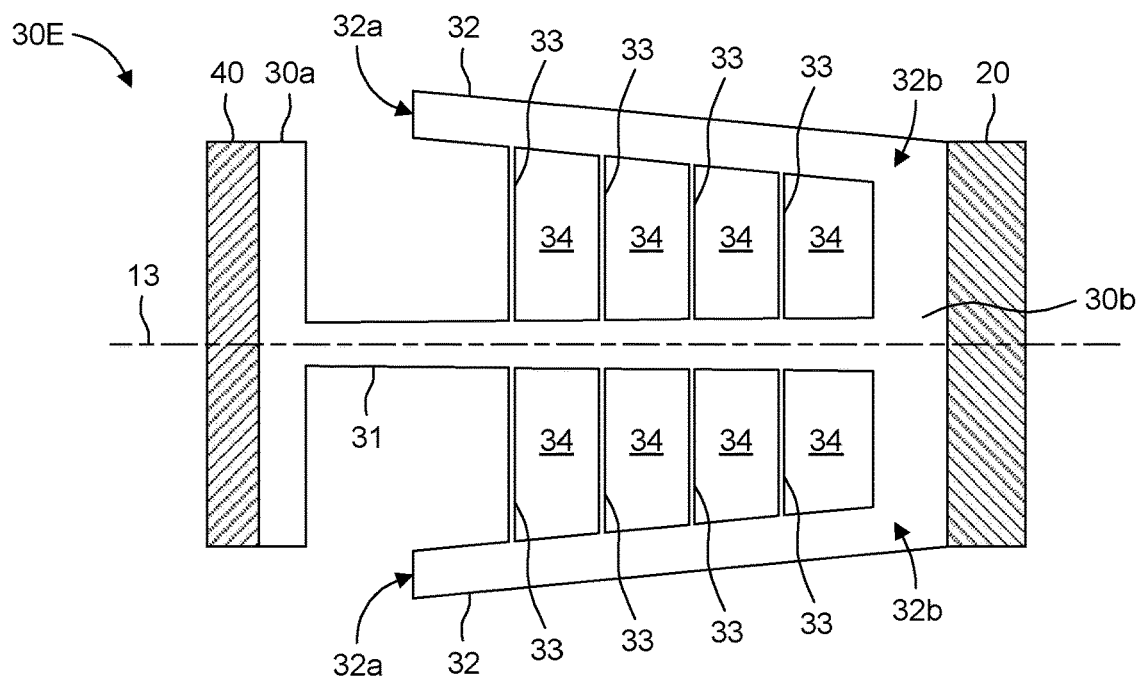
Figure 4F:
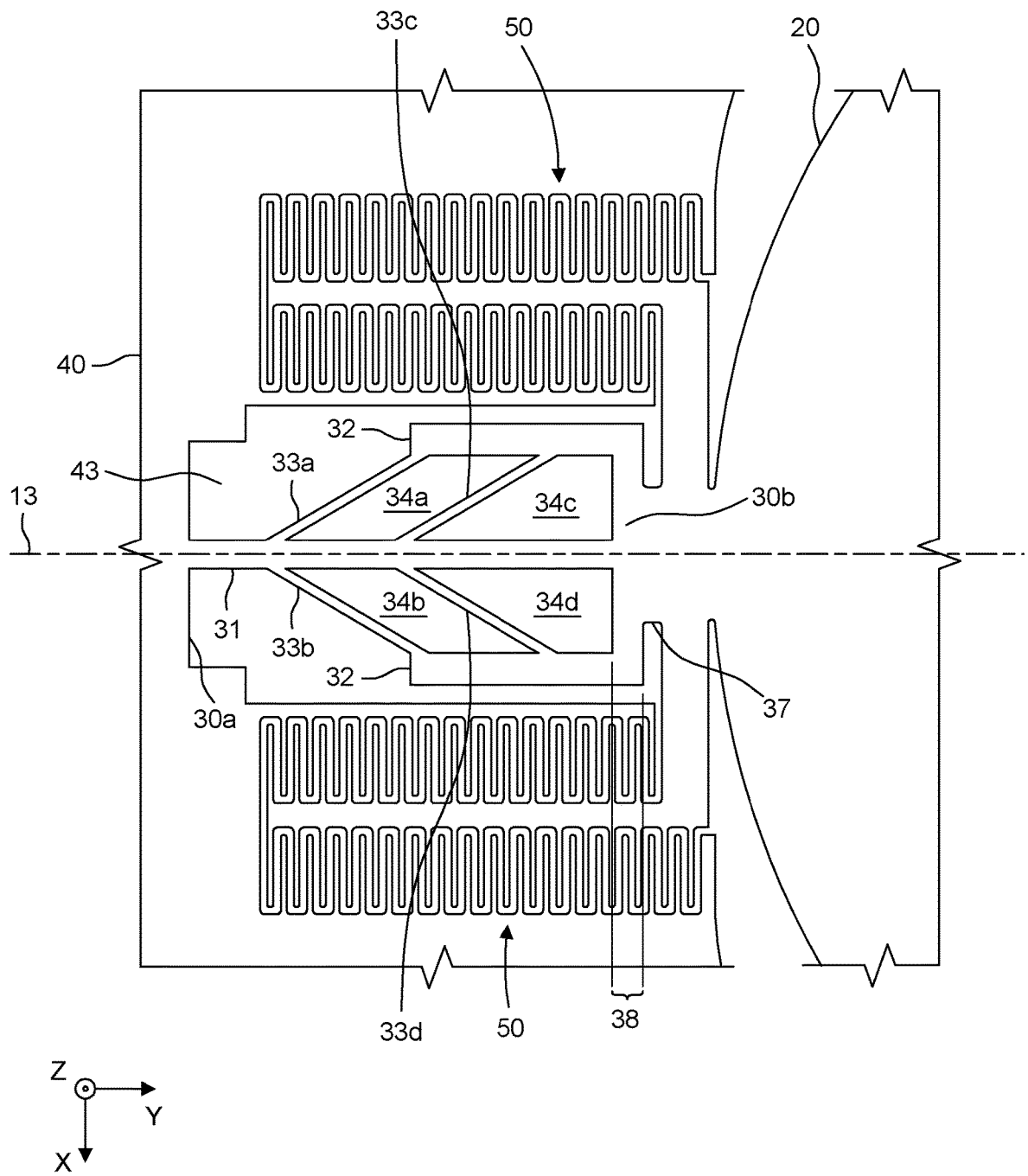
Figure 4G:
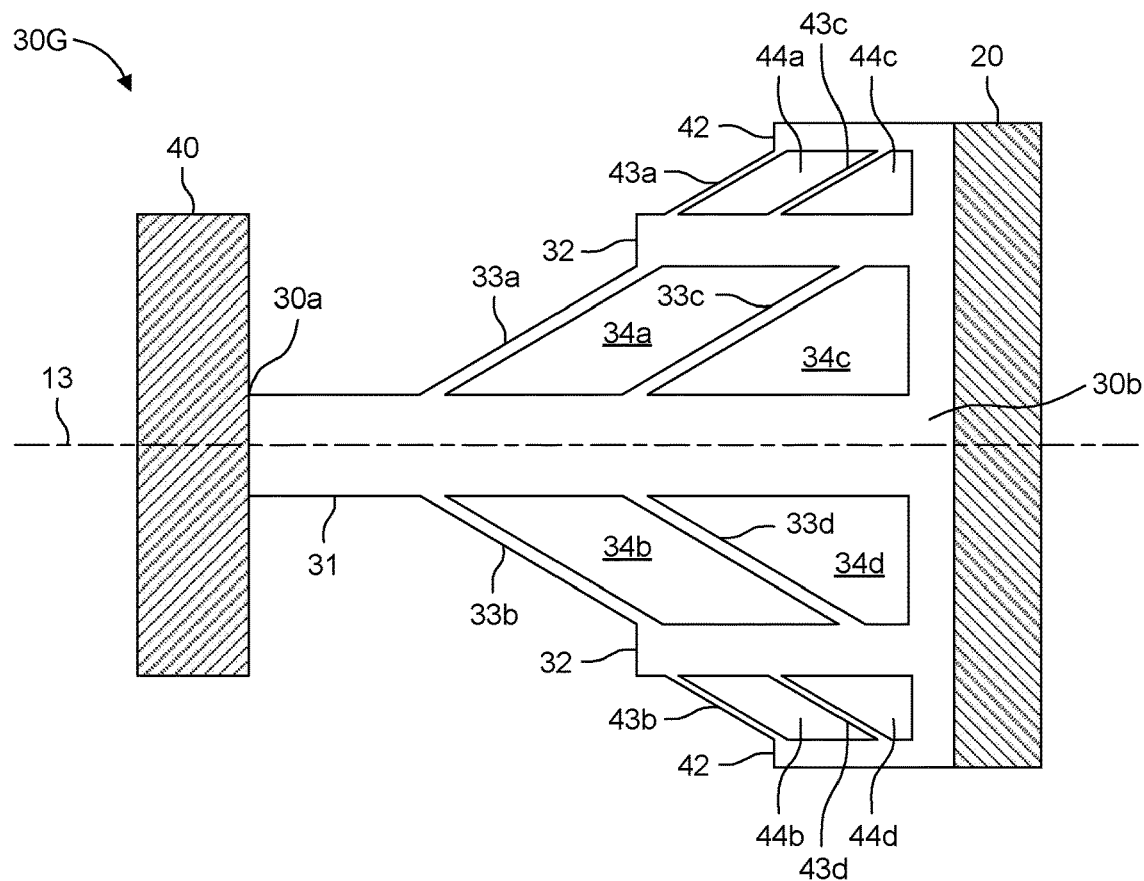

It is noted that the central support beam 31 may be directly coupled to and integrated with the mirror frame 40, as shown in FIG. 4G. In this sense, the corresponding longitudinal end of the central support beam 31 represents the frame interface 30*a*. The thickness and/or width of the central support beam 31 provides high torsional/rotational stiffness about the rotation axis 13 to overcome the high inertia from the size of the mirror body 20 meeting or exceeding 5 mm thus enabling high resonance frequency operation (≥2 kHz). The uniform thickness (i.e., in the Z dimension) and/or width (i.e., in the X dimension) of the central support beam 31 also limits the mechanical stress level to 3 GPa or less, and preferably to 2.5 GPa or less, and more preferably to 2 GPa or less, for large mechanical tilt angles of 10° to 15°, or greater. For example, the thickness of the central support beam 31 may be in the range of 10-100 μm and the width of the central support beam 31 may be in the range of 20 μm-500 μm. More particularly, the central support beam 31 has a mechanical stress level of 2 GPa or less with a maximum deflection angle of the mirror body 20 up to 11.5° and the central support beam 31 has a mechanical stress level of 3 GPa or less with a maximum deflection angle of the mirror body 20 up to 15°.

It is further noted that each of the suspension assemblies 30 includes at least two interior support beams 33 that extend from the central support beam 31 in opposite directions towards different outer support beams 32. This thickness and the width dimensions of the interior support beams 33 is smaller than the thickness and width dimensions of the central support beam 31, possibly by a considerable amount. For example, the thickness of the interior support beams 33 may be in the range of 10-100 μm and the width of the interior support beams 33 may be in the range of 10 μm-40 μm, and may be configured to be in the range of 2% to 60% of the thickness of the central support beam 31.

Together, interior support beams 33 may form a spring-like web that provides a small degree of torsional/rotational stiffness about the rotation axis 13 and a large degree of stiffness in other (i.e., at least one) rotational and/or translational directions. Alternative nomenclature for the interior support beams 33 includes: spring support beams, web support beams, angled support beams, and/or brace support beams.

The outer support beams 32 provide a structure for connecting the interior support beams 33 to the mirror body interface 30b and/or to the mirror body 20.

Turning to FIG. 4A, a suspension assembly 30A is provided. A longitudinal dimension of the central support beam 31 extends along the rotation axis 13 between the mirror frame 40 and the mirror body 20. In this example, the central support beam 31 is directly integrated with and coupled to the frame interface 30a and the mirror body interface 30b. However, it is conceivable that the central support beam 31 is directly integrated with and coupled to the mirror frame 40 and the mirror body 20.

The outer support beams 32 each have a longitudinal dimension that extends parallel to the rotation axis 13 and are connected at one end to the mirror body interface 30b. However, it is conceivable that the outer support beams 32 may be directly integrated with and coupled to the mirror body 20.

The suspension assembly 30a further includes two pairs of angled interior support beams 33a, 33b, 33c, and 33d symmetrically arranged with respect to the central support beam 31 and the rotation axis 13. The angled interior support beams 33a, 33b, 33c, and 33d branch off from the central support beam 31 at a predefined angle. Angled interior support beam 33a is parallel to 33c and angled interior support beam 33b is parallel to 33d.

The first pair of angled interior support beams 33a and 33b are symmetrically connected to the central support beam 31 at their connection points 35 and are symmetrically connected to their corresponding outer support beam 32 at connection points 36. Thus, the first pair of angled interior support beams 33a and 33b form a symmetrical V-shape with their connection points 35 having a smaller lateral distance D3 from the mirror frame 40 in a direction parallel to the rotation axis 13 than the lateral distance D4 of their respective connection points 36. In other words, the angle formed between each angled interior support beam and the central support beam is greater than 0° and less than 90°. Thus, the opening of the "V" faces towards the mirror body 20, whereas the vertex of the "V" points towards the mirror frame 40 and it can be said that the angled interior support beams 33 are angled towards the mirror body 20.

Similarly, the second pair of angled interior support beams 33c and 33d are symmetrically connected to the central support beam 31 at their connection points 35 and are symmetrically connected to their corresponding outer support beam 32 at connection points 36. Like the first pair, the second pair of angled interior support beams 33c and 33d form a symmetrical V-shape and it can be said that the angled interior support beams 33 are angled towards the mirror body 20.

The angled interior support beams 33a, 33b, 33c, and 33d may also be arranged such that the connection points 36 of the first pair 33a and 33b are aligned with the connection points 35 of the second pair 33c and 33d in a direction perpendicular to the rotation axis 13.

Cavities 34, including cavities 34a, 34b, 34c, and 34d, are formed between the respective support structures of the suspension assembly 30 and are defined by the area between these support structures. The cavities 34 permit rotational movement of the angled interior support beams 33a, 33b, 33c, and 33d about the rotation axis 13 as the mirror body 20 oscillates about the rotation axis 13.

The angled interior support beams 33 behave like a set of springs that connect the central support beam 31 to the mirror body 20 via the outer support beams 32 that are laterally spaced from the rotation axis 13 is a direction perpendicular to the rotation axis 13. In some designs, only the first or the second pair of angled interior support beams may be present. In other designs, additional one or more pairs of angled interior support beams may be added. In this way, the torsional/rotational stiffness with respect to the rotational direction of the mirror body 20 about the rotation axis 13 may be fined tuned. In other words, each pair of angled interior support beams may add to the torsional/rotational stiffness provided by the central support beam 31 with respect to the rotational direction of the mirror body 20 about the rotation axis 13. Additionally, the number of pairs of angled interior support beams adjusts the stiffness of the suspension assembly 30 with respect to the undesired modes and motions of the mirror body 20.

FIG. 4B illustrates a suspension assembly 30B similar to the suspension assembly 30A illustrated in FIG. 4A, with the exception that suspension assembly 30B includes additional pairs of angled interior support beams symmetrically arranged with respect to the central support beam 31 and the rotation axis 13. The number of angled interior support beams is increased, thereby creating a denser web and reaching higher stiffnesses for undesired modes and motions while having little impact or negligible impact on the stiffness in desired rotational motion about the rotation axis 13.

FIG. 4C illustrates a suspension assembly 30C similar to the suspension assembly 30A illustrated in FIG. 4A, with the exception that the angled interior support beams 33 are asymmetrically arranged with respect to the central support beam 31 and rotation axis 13. Here, the connection points 35a, 35b, 35c, and 35d are interleaved along the direction of the rotation axis 13 such that they are arranged at different lateral distances from the mirror frame 40 (or the mirror body 20) along the rotation axis 13. Similarly, connection points 36, 36b, 36c, and 36d are interleaved and are arranged at different lateral distances from the mirror frame 40 (or the mirror body 20) along the rotation axis 13. Here, a stiffness with respect to rotation around the desired axis is similar in both symmetric and asymmetric cases, whereas a stiffnesses for undesired modes and undesired motions can be adjusted or fine-tuned (e.g., for higher modes frequencies) by varying the symmetry or asymmetry.

FIG. 4D illustrates a suspension assembly 30D that includes orthogonal interior support beams 33, where orthogonal means orthogonal to the central support beam 31 and the rotation axis 13. The orthogonal interior support beams 33 are symmetrically arranged with respect to the central support beam 31 and the rotation axis 13 such that each pair of orthogonal interior support beams 33 is symmetrically connected to the central support beam 31 at their connection points 35 and are symmetrically connected to their corresponding outer support beam 32 at connection points 36. In this case, all the connection points 35 and 36 of a pair of orthogonal interior support beams 33 has the same lateral distance from the mirror frame 40 (or the mirror body 20). Together, the orthogonal interior support beams 33 for a spring-like web.

It will be appreciated that the orthogonal interior support beams 33 may be asymmetrically arranged with respect to the central support beam 31 and the rotation axis 13 in a similar manner illustrated in FIG. 4C such that the connection points 35 are staggered along the rotation axis 13.

FIG. 4E illustrates a suspension assembly 30E that includes orthogonal interior support beams 33 and oblique outer support beams 32. As similarly described with reference to suspension assembly 30D, the orthogonal interior support beams 33 are symmetrically arranged with respect to the central support beam 31 and the rotation axis 13. However, in suspension assemblies 30A-30D, the outer support beams 32 extended parallel to the rotation axis 13 and the central support beam 31. In the case of suspension assembly 30E, the oblique outer support beams 32 extends at a slanting angle that is neither parallel nor perpendicular to the rotation axis 13. In this case, both outer support beams 32 have two ends 32a and 32b where a lateral distance between the central support beam 31 and end 32b is less than a lateral distance between the central support beam 31 and end 32a. accordingly, the oblique outer support beams 32 increase in length as the move further from the mirror body 20 and closer towards the mirror frame 40. Having the outer support beams at an angle enables adjusting the length of the interior support beams independently from each other. This can be useful to tune the stiffness/stress for each beam independently. This principle can also be applied for designs in shown in FIGS. 4B and 4C arrangement.

It will be appreciated that the orthogonal interior support beams 33 may be asymmetrically arranged with respect to the central support beam 31 and the rotation axis 13 in a similar manner illustrated in FIG. 4C such that the connection points 35 are staggered along the rotation axis 13.

FIG. 4F illustrates a suspension assembly 30F that is similar to suspension assembly 30A, but shows one implementation of the mirror body interface 30b (i.e., the mirror support structure) in greater detail. The mirror body interface 30b has a central portion 37 that is directly coupled to the mirror body 20. The dimension of this central portion 37 perpendicular to the rotation axis 13 is greater than the width of the central support beam 31 in the same direction (i.e., in the X direction), while their respective thicknesses in the Z direction may be equal. The remaining portion of the mirror body interface 30b includes a support structure 38 that extends lengthwise in a direction perpendicular to the rotation axis 13 (e.g., the support structure 38 extends lengthwise in the X direction). Each opposing end of the support structure is coupled to one of the outer support beams 32. The outer support beams 32 are formed as cantilevers extending from the mirror body interface 30b and are connected to the central support beam 31 via the interior support beams 33. The structure of the mirror body interface 30b as shown can be applied to any of the embodiments described herein.

FIG. 4G illustrates another suspension assembly 30G implemented in a MEMS device in accordance with one or more embodiments. The suspension assembly 30G is similar to suspension assembly 30A, with the exception that, firstly, the central support beam 31 is directly coupled to and integrated with the mirror frame 40 at the frame interface 30a and, secondly, it includes an additional tier of outer support beams 42 and interior support beams 43 (i.e., 43a-43d) that defined additional cavities 44 (i.e., 44a-44d).

The additional outer support beams 42 are symmetrically arranged on opposite sides of the central support beam 31 at a distance greater than outer support beams 32. The additional outer support beams 42 extend lengthwise from the mirror body interface 30b parallel to the rotation axis 13 and extend partially towards the frame 40. Thus, the additional outer support beams 42 are formed as cantilevers extending from the mirror body interface 30b and are connected to their respective additional outer support beam 42 via their respective additional interior support beams 43. The length of the additional outer support beams 42 (i.e., the longitudinal dimension thereof) in the direction parallel to the rotation axis 13 may be less than the length of the outer support beams 32, as shown. Alternatively, the length of the additional outer support beams 42 may be equal to or greater than the length of the outer support beams 32.

Altering the length of the additional outer support beams 42 may allow for the additional interior support beams 43 to be either angled toward the mirror body 20, angled away from the mirror body 20, or to extend orthogonal to the rotation axis (i.e., orthogonal to the central support beam 31, the outer support beams 32, and the additional outer support beams 42).

The additional interior support beams 43 couple the additional outer support beam 42 to their respective outer support beam 32 and indirectly coupled the additional outer support beam 42 to the central support beam 31. Thus, like the outer support beams 32, the additional outer support beams 42 oscillate in and out of the suspension assembly recess 43 as the mirror body 20 oscillates.

It is noted that the additional outer support beams 42 and the additional interior support beams 43 may be configured and have properties according to any of the arrangements provided herein with regard to the outer support beams 32 and the interior support beams 33. Thus, the additional interior support beams 43a and 43c may be symmetric or asymmetric with the additional interior support beams 43b and 43d. Additionally, the additional interior support beams 43 may be angled away from the mirror body 20, while the interior support beams 33 may be angled towards the mirror body 20, or vice versa. Furthermore, while the additional outer support beams 42 are shown as being parallel to the rotation axis 13, they may instead extend obliquely as similarly described in FIG. 4E with regard to the outer support beams 32.

The additional interior support beams 43 may be used to fine tune the torsional stiffness about the target axis 13 by adapting their thickness or adapting the number thereof. The additional interior support beams 43 further increase the stiffness to the undesired translational and rotational modes and enable good mode separation, with the operation frequency of the first mode about the rotation axis 13 being then much lower than all the other undesired modes.

Figure 4H:
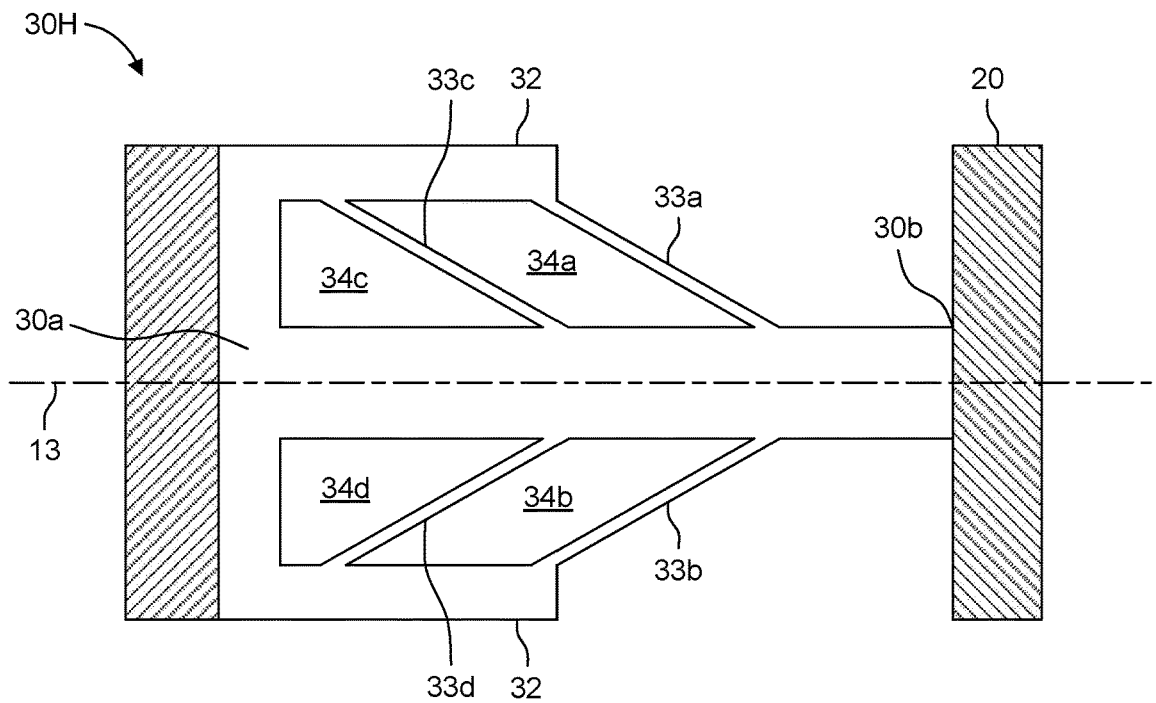

FIG. 4H illustrates another suspension assembly 30H implemented in a MEMS device in accordance with one or more embodiments. The suspension assembly 30H is similar to suspension assembly 30A, with the exception that the arrangement is inverted. Thus, the outer support beams 32 extend from the frame 40 (i.e., from the frame interface 30a) partially towards the mirror body 20 and the interior support beams 33 are angled towards the frame 40 (i.e., angled away from the mirror body 20). In addition, the central support beam 31 is directly coupled to and integrated with the mirror body 20 at the mirror body interface 30b.

It is noted that any of the variations provided in FIGS. 4B-4G may be also be inverted in a similar manner. Thus, suspension assembly 30H may be adapted according to any of these variants.

According to the suspension assemblies 30A-30H, high stiffness is achieved for the desired rotational motion about the rotation axis 13 by proper dimensioning of the central support beam 31. Additionally, interior support beams, including additional interior support beams of FIG. 4G, provide a smaller contribution to the stiffness with regard to the rotational motion about the rotation axis 13 which allows for separate design tuning (geometry and number of springs) for mechanical stress optimization, mode separation (stiffness), and non-linearity of the MEMS mirror 12 (i.e., the oscillation frequency of the mirror increases non-linearly with an increase in oscillation amplitude (i.e., deflection angle amplitude θ)).

Stiffness and stress can be tuned by adjusting the dimension and geometry the central support beam 31, the outer support beams 32, and the interior support beams 33. A proper design of the central support beam 31 enables also tuning of suspensions system non-linearity (non-linear relationship between applied force and achieved mechanical tilt angle). A non-linear spring system can be of interest in some application where the angle can be controlled by adjusting the frequency.

Additionally, the suspension assemblies 30A-30H have a compact structure and do not require a thin torsion bar, which may compromise reliability in some cases.

Although embodiments described herein relate to a MEMS device with a mirror, it is to be understood that other implementations may include optical devices other than MEMS mirror devices, including other non-linear oscillating structures, including those not related to LIDAR. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A microelectromechanical system (MEMS) device, comprising:
    an oscillator structure configured to oscillate about a rotation axis;
    a frame that is rotationally fixed, the frame comprising a frame recess within which the oscillator structure is suspended; and
    a suspension assembly mechanically coupled to and between the oscillator structure and the frame, the suspension assembly configured to suspend the oscillator structure within the frame recess,
    wherein the suspension assembly comprises:
        a central support beam that extends lengthwise along the rotation axis, the central support beam being mechanically coupled to and between the oscillator structure and the frame;
        a first outer support beam mechanically coupled to the oscillator structure and laterally displaced from the central support beam in a first direction orthogonal to the rotation axis;
        at least one first interior support beam directly coupled to and between the central support beam and the first outer support beam,
        wherein each of the at least one first interior support beam has a first connection point to the central support beam and a second connection point to the first outer support beam, wherein each first connection point has a first corresponding lateral distance from the frame and each second connection point has a second corresponding lateral distance from the frame that is greater than the first corresponding lateral distance;

a second outer support beam mechanically coupled to the oscillator structure and laterally displaced from the central support beam in a second direction orthogonal to the rotation axis, wherein the second direction is opposite to the first direction; and at least one second interior support beam directly coupled to and between the central support beam and the second outer support beam, wherein each of the at least one second interior support beam has a third connection point to the central support beam and a fourth connection point to the second outer support beam, wherein each third connection point has a third corresponding lateral distance from the frame and each fourth connection point has a fourth corresponding lateral distance from the frame that is greater than the third corresponding lateral distance.

2. The MEMS device of claim 1, wherein the oscillator structure, the frame, and the suspension assembly form a one-piece integral construction made of a semiconductor material.

3. The MEMS device of claim 2, wherein the oscillator structure, the frame, and the suspension assembly share a common main surface.

4. The MEMS device of claim 1, wherein the suspension assembly further comprises an oscillator structure interface that mechanically couples the central support beam, the first outer support beam, and the second outer support beam to the oscillator structure.

5. The MEMS device of claim 4, wherein:
the first outer support beam and the second outer support beam both extend from the oscillator structure interface partially towards the frame in parallel to the rotation axis.

6. The MEMS device of claim 4, wherein:
the first outer support beam and the second outer support beam both extend obliquely from the oscillator structure interface partially towards the frame.

7. The MEMS device of claim 1, wherein:
each of the at least one first interior support beam extends obliquely from the central support beam to the first outer support beam, and
each of the at least one second interior support beam extends obliquely from the central support beam to the second outer support beam.

8. The MEMS device of claim 7, wherein:
the at least one first interior support beam is symmetric with the at least one second interior support beam about the rotation axis.

9. The MEMS device of claim 8, wherein:
each of the at least one first interior support beam is aligned with a different one of the at least one second interior support beam to form an interior support beam, wherein each interior support beam pair forms a V-shape.

10. The MEMS device of claim 7, wherein:
the at least one first interior support beam is asymmetric with the at least one second interior support beam about the rotation axis.

11. The MEMS device of claim 1, wherein:
each of the at least one first interior support beam extends orthogonally from the central support beam to the first outer support beam in the first direction, and
each of the at least one second interior support beam extends orthogonally from the central support beam to the second outer support beam in the second direction.

12. The MEMS device of claim 11, wherein:
the at least one first interior support beam is symmetric with the at least one second interior support beam about the rotation axis.

13. The MEMS device of claim 11, wherein:
the at least one first interior support beam is asymmetric with the at least one second interior support beam about the rotation axis.

14. The MEMS device of claim 1, wherein:
the central support beam, the first outer support beam, and the at least one first interior support beam define at least one first cavity therebetween, and
the central support beam, the second outer support beam, and the at least one second interior support beam define at least one second cavity therebetween.

15. The MEMS device of claim 1, wherein:
the at least one first interior support beam includes a plurality of first interior support beams, each being directly coupled to and between the central support beam and the first outer support beam, and
the at least one second interior support beam includes a plurality of second interior support beams, each being directly coupled to and between the central support beam and the second outer support beam.

16. The MEMS device of claim 1, further comprising:
a driver configured to drive an oscillation of the oscillator structure about the rotation axis,
wherein the oscillator structure incudes a main surface having a dimension of at least 5 millimeters, the main surface being arranged opposite to the frame recess, and
wherein the suspension assembly enables the driver to drive the oscillation at a resonance frequency of at least 2 kHz with a maximum deflection angle of at least 10° while limiting a mechanical stress level of the central support beam to 3 GPa or less.

17. The MEMS device of claim 16, wherein the dimension is a diameter or a length of the main surface of the oscillator structure.

18. The MEMS device of claim 1, further comprising:
a driver configured to drive an oscillation of the oscillator structure about the rotation axis,
wherein the oscillator structure incudes a main surface having a dimension of at least 5 millimeters, the main surface being arranged opposite to the frame recess, and
wherein the central support beam has a thickness dimension and a width dimension that provide a rotational stiffness in a rotational direction of the oscillation about the rotation axis sufficient to enable the driver to drive the oscillation at a resonance frequency of at least 2 kHz with a maximum deflection angle of at least 10° while limiting a mechanical stress level of the central support beam to 3 GPa or less.

19. The MEMS device of claim 1, further comprising:
a driver configured to drive an oscillation of the oscillator structure about the rotation axis,
wherein the oscillator structure incudes a main surface having a dimension of at least 5 millimeters, the main surface being arranged opposite to the frame recess, and
wherein the central support beam has a thickness dimension and a width dimension that provide a rotational stiffness in a rotational direction of the oscillation about the rotation axis sufficient to enable the driver to drive the oscillation at a resonance frequency of at least 2 kHz with a maximum deflection angle of at least 10° while limiting a mechanical stress level of the central support beam to 2 GPa or less.

20. The MEMS device of claim 1, wherein the suspension assembly further comprises a frame structure interface that mechanically couples the central support beam, the first outer support beam, and the second outer support beam to the frame.

21. The MEMS device of claim 20, wherein:
the first outer support beam and the second outer support beam both extend from the frame structure interface partially towards the oscillator structure in parallel to the rotation axis.

22. The MEMS device of claim 20, wherein:
the first outer support beam and the second outer support beam both extend obliquely from the frame structure interface partially towards the oscillator structure.

23. The MEMS device of claim 1, wherein the suspension assembly further comprises:
a first additional outer support beam mechanically coupled to the oscillator structure and laterally displaced from the central support beam and from the first outer support beam in the first direction, the first additional outer support beam being spaced further from the central support beam than the first outer support beam in the first direction;
at least one first additional interior support beam directly coupled to and between the first additional outer support beam and the first outer support beam;
a second additional outer support beam mechanically coupled to the oscillator structure and laterally displaced from the central support beam and from the second outer support beam in the second direction, the second additional outer support beam being spaced further from the central support beam than the second outer support beam in the second direction; and
at least one second additional interior support beam directly coupled to and between the second additional outer support beam and the second outer support beam.

24. An oscillator system, comprising:
an oscillator structure configured to oscillate about a rotation axis at a resonance frequency of at least 2 kHz with a maximum deflection angle of at least 10°, wherein the oscillator structure incudes a main surface having a dimension of at least 5 millimeters;
a frame that is rotationally fixed, the frame comprising a frame recess within which the oscillator structure is suspended; and
a suspension assembly mechanically coupled to and between the oscillator structure and the frame, the suspension assembly configured to suspend the oscillator structure within the frame recess,
wherein the suspension assembly comprises:
a central support beam that extends lengthwise along the rotation axis, the central support beam being mechanically coupled to and between the oscillator structure and the frame, wherein the central support beam twists about the rotation axis as the oscillator structure oscillates and has a mechanical stress level of 3 GPa or less while the oscillator structure oscillates about the rotation axis at the resonance frequency of at least 2 kHz with the maximum deflection angle of at least 10°;
a first outer support beam mechanically coupled to the oscillator structure and laterally displaced from the central support beam in a first direction orthogonal to the rotation axis;
at least one first interior support beam directly coupled to and between the central support beam and the first outer support beam,
wherein the at least one first interior support beam includes a plurality of first interior support beams, each being directly coupled to and between the central support beam and the first outer support beam;
a second outer support beam mechanically coupled to the oscillator structure and laterally displaced from the central support beam in a second direction orthogonal to the rotation axis, wherein the second direction is opposite to the first direction; and
at least one second interior support beam directly coupled to and between the central support beam and the second outer support beam,
wherein the at least one second interior support beam includes a plurality of second interior support beams, each being directly coupled to and between the central support beam and the second outer support beam.

25. The oscillator system of claim 24, wherein the oscillator structure is a microelectromechanical system (MEMS) mirror and the main surface is a reflective surface.

26. The oscillator system of claim 24, wherein the central support beam twists about the rotation axis as the oscillator structure oscillates and has a mechanical stress level of 2 GPa or less while the oscillator structure oscillates about the rotation axis at the resonance frequency of at least 2 kHz with the maximum deflection angle of at least 10°.

27. A microelectromechanical system (MEMS) device, comprising:
an oscillator structure configured to oscillate about a rotation axis;
a frame that is rotationally fixed, the frame comprising a frame recess within which the oscillator structure is suspended; and
a suspension assembly mechanically coupled to and between the oscillator structure and the frame, the suspension assembly configured to suspend the oscillator structure within the frame recess,
wherein the suspension assembly comprises:
a central support beam that extends lengthwise along the rotation axis, the central support beam being mechanically coupled to and between the oscillator structure and the frame;
a first outer support beam mechanically coupled to the oscillator structure and laterally displaced from the central support beam in a first direction orthogonal to the rotation axis;
at least one first interior support beam directly coupled to and between the central support beam and the first outer support beam,
wherein each of the at least one first interior support beam extends orthogonally from the central support beam to the first outer support beam in the first direction;
a second outer support beam mechanically coupled to the oscillator structure and laterally displaced from the central support beam in a second direction orthogonal to the rotation axis, wherein the second direction is opposite to the first direction; and
at least one second interior support beam directly coupled to and between the central support beam and the second outer support beam, wherein each of the at least one second interior support beam extends orthogonally from the central support beam to the second outer support beam in the second direction.

* * * * *